United States Patent
Sakamoto et al.

(10) Patent No.: US 9,054,342 B2
(45) Date of Patent: Jun. 9, 2015

(54) APPARATUS AND METHOD FOR ETCHING ORGANIC LAYER

(71) Applicant: Samsung Display Co., Ltd., Yongin (KR)

(72) Inventors: Yoshiaki Sakamoto, Yongin (KR); Nam Ha, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 22 days.

(21) Appl. No.: 14/029,296

(22) Filed: Sep. 17, 2013

(65) Prior Publication Data

US 2014/0357087 A1    Dec. 4, 2014

(30) Foreign Application Priority Data

May 29, 2013 (KR) .......................... 10-2013-0061260

(51) Int. Cl.
*H01L 21/4763* (2006.01)
*H01L 51/56* (2006.01)

(52) U.S. Cl.
CPC ...................................... *H01L 51/56* (2013.01)

(58) Field of Classification Search
CPC ....................................................... H01L 51/56
USPC .................................................. 438/718, 716
See application file for complete search history.

(56) References Cited

U.S. PATENT DOCUMENTS

| 2009/0197353 A1* | 8/2009 | Yoshizawa et al. ............... 438/8 |
| 2012/0097992 A1  | 4/2012 | Jeong |

FOREIGN PATENT DOCUMENTS

| JP | 2008-287889 | 11/2008 |
| JP | 2011-204366 | 10/2011 |
| JP | 2011-216778 | 10/2011 |
| JP | 2012-049376 | 3/2012 |
| KR | 10-2012-0042155 | 5/2012 |

* cited by examiner

*Primary Examiner* — Roberts Culbert
(74) *Attorney, Agent, or Firm* — H.C. Park & Associates, PLC

(57) ABSTRACT

Provided are an apparatus and method for etching an organic layer, in which an organic material deposited in a non-layer forming area of a substrate is etched. The apparatus includes an etching chamber; a plasma generator configured to supply plasma into the etching chamber; a stage disposed in the etching chamber and configured to support the substrate; and a mask configured to guide the plasma toward the non-pixel area.

10 Claims, 10 Drawing Sheets

APPARATUS AND METHOD FOR ETCHING ORGANIC LAYER

CROSS-REFERENCE TO RELATED PATENT APPLICATION

This application claims the benefit of Korean Patent Application No. 10-2013-0061260, filed on May 29, 2013, in the Korean Intellectual Property Office, the disclosure of which is incorporated herein in its entirety by reference.

BACKGROUND

1. Field

Exemplary embodiments of the present invention relate to an apparatus and method for etching an organic layer, and more particularly, to an apparatus and method for etching an organic layer, in which an organic layer deposited in a non-layer forming area of a substrate is etched.

2. Discussion of the Background

An organic light-emitting display device has a wide viewing angle, a high contrast ratio, and a high response speed, and thus, is regarded as a next-generation display device.

An organic light-emitting display device includes intermediate layers (including an emission layer) disposed between a first electrode and a second electrode. The electrodes and the intermediate layers may be formed using various methods, one of which is an independent deposition method. When an organic light-emitting display device is manufactured by using the deposition method, a fine metal mask (FMM) having the same pattern as that of an organic layer to be formed is disposed to closely contact a substrate on which the organic layer and the like are to be formed, and an organic layer material is deposited on the FMM to form the organic layer having the desired pattern.

Information disclosed in this Background section was already known to the inventors of the present invention before achieving the present invention or is technical information acquired in the process of achieving the present invention. Therefore, it may contain information that does not form the prior art that is already known in this country to one of ordinary skill in the art.

BRIEF SUMMARY OF THE INVENTION

Exemplary embodiments of the present invention provide an apparatus and method for etching an organic layer, in which an organic material deposited in a non-layer forming area of a substrate is etched, a back flow of plasma into a pixel area is prevented, and flow uniformity of the plasma is improved, to thereby improve etching uniformity.

Additional features of the invention will be set forth in the description which follows, and in part will be apparent from the description, or may be learned by practice of the invention.

According to an aspect of the present invention, there is provided an organic layer etching apparatus for removing an organic layer formed in a non-pixel area of a substrate, the apparatus comprising: an etching chamber; a plasma generator that is disposed at a side of the etching chamber and generates plasma and supplies the plasma into the etching chamber; a stage on the substrate is mounted; and a mask disposed in the etching chamber and covering at least a portion of the substrate, the mask configured to guide the plasma toward the non-pixel area.

According to another aspect of the present invention, there is provided a method of removing an organic layer from a non-pixel area of a substrate, the method comprising: mounting the substrate on a stage in an etching chamber; covering at least a portion of the substrate by moving the stage with respect to the mask; and removing the organic layer from the non-pixel area of the substrate by guiding plasma generated in a plasma generator toward the non-pixel area.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
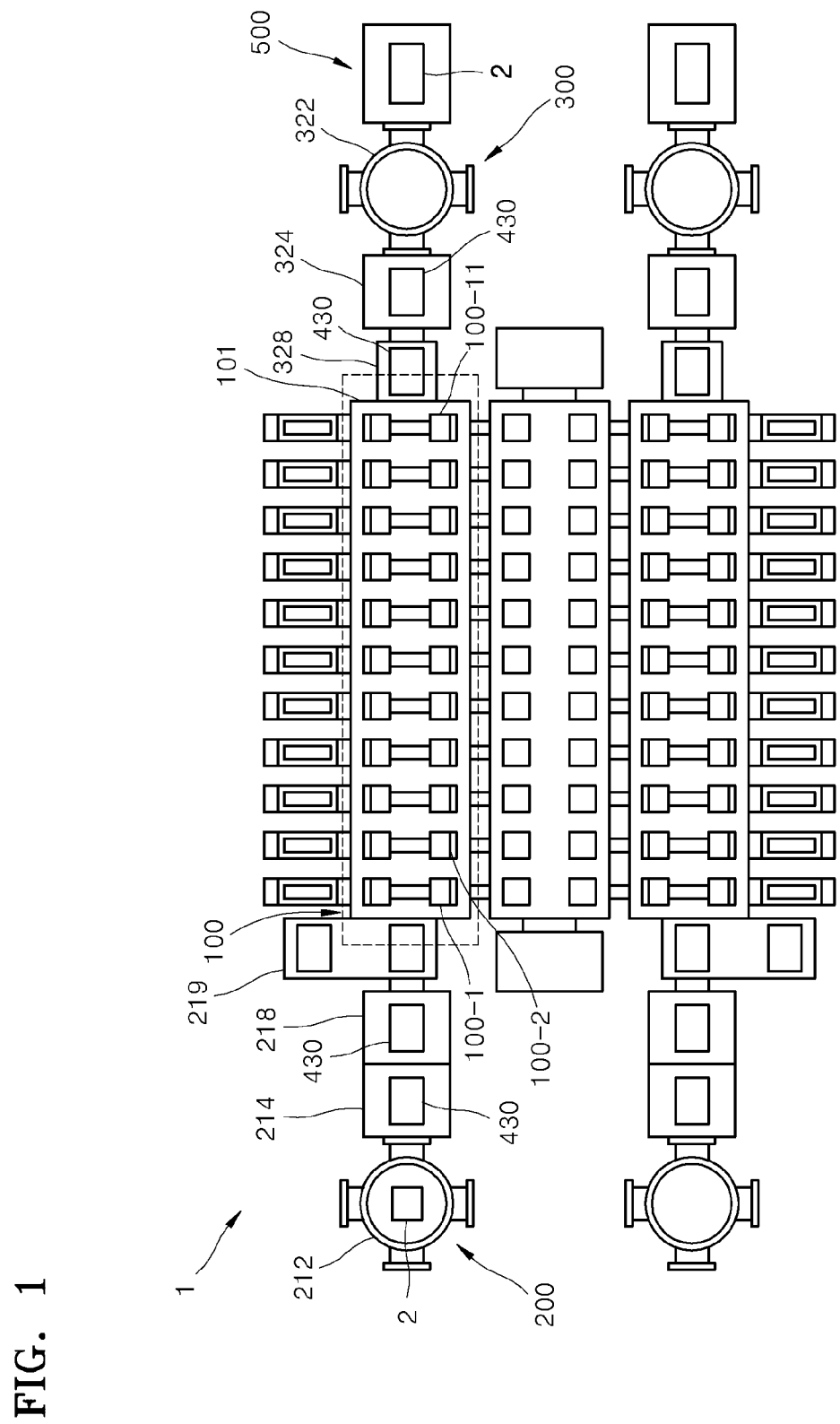
FIG. 1 is a schematic plan view of a systematic configuration of an organic layer deposition apparatus and an organic layer etching apparatus connected thereto, according to an exemplary embodiment of the present invention.

The present invention will now be described more fully with reference to the accompanying drawings, in which exemplary embodiments of the invention are shown. The embodiments will be described in detail such that one of ordinary skill in the art may easily work the present invention. It should be understood that the embodiments of the present invention may vary but do not have to be mutually exclusive. For example, particular shapes, structures, and properties according to a predetermined embodiment described in this specification may be modified in other embodiments without departing from the spirit and scope of the prevent invention. In addition, positions or arrangement of individual components of each of the embodiments may also be modified without departing from the spirit and scope of the present invention. Accordingly, the detailed description below should not be construed as having limited meanings but construed to encompass the scope of the claims and any equivalent ranges thereto. In the drawings, like reference numerals denote like elements in various aspects.

Hereinafter, the present invention will now be described more fully with reference to the accompanying drawings, in which exemplary embodiments of the present invention are shown such that one of ordinary skill in the art may easily work the invention. Expressions such as "at least one of," when preceding a list of elements, modify the entire list of elements and do not modify the individual elements of the list.

Figure 2:
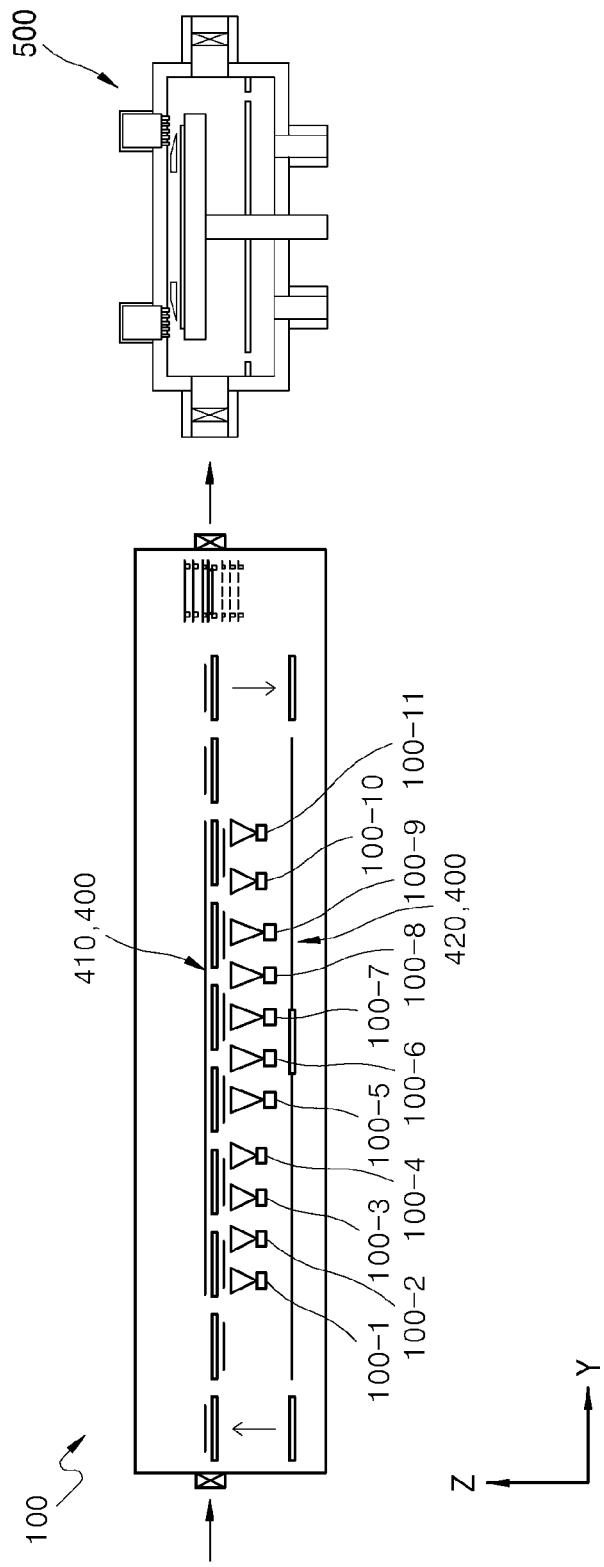
FIG. 2 is a schematic plan view of a systematic configuration of a deposition unit of the organic layer deposition apparatus of FIG. 1 and an organic layer etching apparatus connected thereto, according to an exemplary embodiment of the present invention.

FIG. 1 is a schematic plan view of a systematic configuration of an organic layer deposition apparatus 1 and an organic layer etching apparatus 500 connected thereto, according to an exemplary embodiment of the present invention. FIG. 2 is a schematic plan view of a deposition unit 100 of the organic layer deposition apparatus 1 of FIG. 1 and the organic layer etching apparatus 500 connected thereto, according to an exemplary embodiment of the present invention.

Referring to FIGS. 1 and 2, the organic layer deposition apparatus 1 includes the deposition unit 100, a loading unit 200, an unloading unit 300, and a conveyer unit 400. Also, the organic layer deposition apparatus 500 is disposed at a side of the unloading unit 300.

The loading unit 200 may include a first rack 212, a transport chamber 214, a first inversion chamber 218, and a buffer chamber 219. A plurality of substrates 2, onto which a deposition material has not yet been applied, are stacked on the first rack 212. A transport robot (not shown) included in the transport chamber 214 picks up one of the substrates 2 from the first rack 212, disposes it on a moving unit 430 transferred by a second conveyer unit 420, and moves the moving unit 430, on which the substrate 2 is disposed, into the first inversion chamber 218.

The first inversion chamber 218 is disposed adjacent to the transport chamber 214. The first inversion chamber 218 includes a first inversion robot (not shown) that inverts the moving unit 430 and then loads it on a first conveyer unit 410 of the deposition unit 100.

Referring to FIG. 1, the transport robot of the transport chamber 214 places one of the substrates 2 on a top surface of the moving unit 430. The moving unit 430, on which the substrate 2 is disposed, is then transferred into the first inversion chamber 218. The first inversion robot of the first inversion chamber 218 inverts the first inversion chamber 218, so that the substrate 2 is turned upside down in the deposition unit 100.

The unloading unit 300 is configured to operate in an opposite manner to the loading unit 200 described above. Specifically, a second inversion robot (not shown) in a second inversion chamber 328 inverts the moving unit 430, which has passed through the deposition unit 100 while the substrate 2 is disposed on the moving unit 430, and then moves the moving unit 430, on which the substrate 2 is disposed, into an ejection chamber 324. Then, an ejection robot (not shown) takes the moving unit 430, on which the substrate 2 is disposed, out of the ejection chamber 324, separates the substrate 2 from the moving unit 430, and then loads the substrate 2 on a second rack 322. The moving unit 430, separated from the substrate 2, is returned to the loading unit 200, via the second conveyer unit 420.

However, the present invention is not limited to the above example. For example, when disposing the substrate 2 on the moving unit 430, the substrate 2 may be fixed onto a bottom surface of the moving unit 430 and then moved into the deposition unit 100. In such an embodiment, for example, the first inversion robot of the first inversion chamber 218 and the second inversion robot of the second inversion chamber 328 may be omitted.

The deposition unit 100 may include at least one chamber for deposition. In one embodiment, as illustrated in FIGS. 1 and 2, the deposition unit 100 includes a chamber 101 in which a plurality of organic layer deposition assemblies 100-1 through 100-n, may be disposed. Referring to FIG. 1, 11 organic layer deposition assemblies, i.e., the organic layer deposition assembly 100-1, the organic layer deposition assembly 100-2, . . . , and the organic layer deposition assembly 100-11, are disposed in the chamber 101. However, the number of organic layer deposition assemblies may vary with a desired deposition material and deposition conditions. The chamber 101 is maintained at a vacuum during the deposition process.

In the embodiment illustrated in FIG. 1, the moving unit 430 with the substrate 2 fixed thereon may be moved at least to the deposition unit 100, or may be moved sequentially to the loading unit 200, the deposition unit 100, and the unloading unit 300, by the first conveyer unit 410. The moving unit 430 that is separated from the substrate 2 in the unloading unit 300 may be moved back to the loading unit 200 by the second conveyer unit 420. The first conveyer unit 410 passes through the chamber 101 when passing through the deposition unit 100, and the second conveyer unit 420 conveys the moving unit 430 from which the substrate 2 is separated.

In the present exemplary embodiment, the organic layer deposition apparatus 1 is configured such that the first conveyer unit 410 and the second conveyer unit 420 are respectively disposed above and below one another, so that after the moving unit 430, on which deposition has been completed while passing through the first conveyer unit 410, is separated from the substrate 2 in the unloading unit 300, the moving unit 430 is returned to the loading unit 200 via the second conveyer unit 420 formed below the first conveyer unit 410. Thus, the organic layer deposition apparatus 1 may have improved space utilization efficiency.

The organic layer etching apparatus 500 is disposed at the side of the unloading unit 300. An organic layer is deposited in stripes in the organic layer deposition apparatus 1, which is an in-line type, as illustrated in FIGS. 1 and 2. Thus, by passing through the organic layer deposition apparatus 1, an organic layer may also be unintentionally formed in a non-layer forming area of the substrate 2 on which the organic layer is deposited. Accordingly, the organic layer etching apparatus 500 is disposed at a side of the organic layer deposition apparatus 1, in order to remove the organic layer formed in the non-layer forming area.

Figure 3:
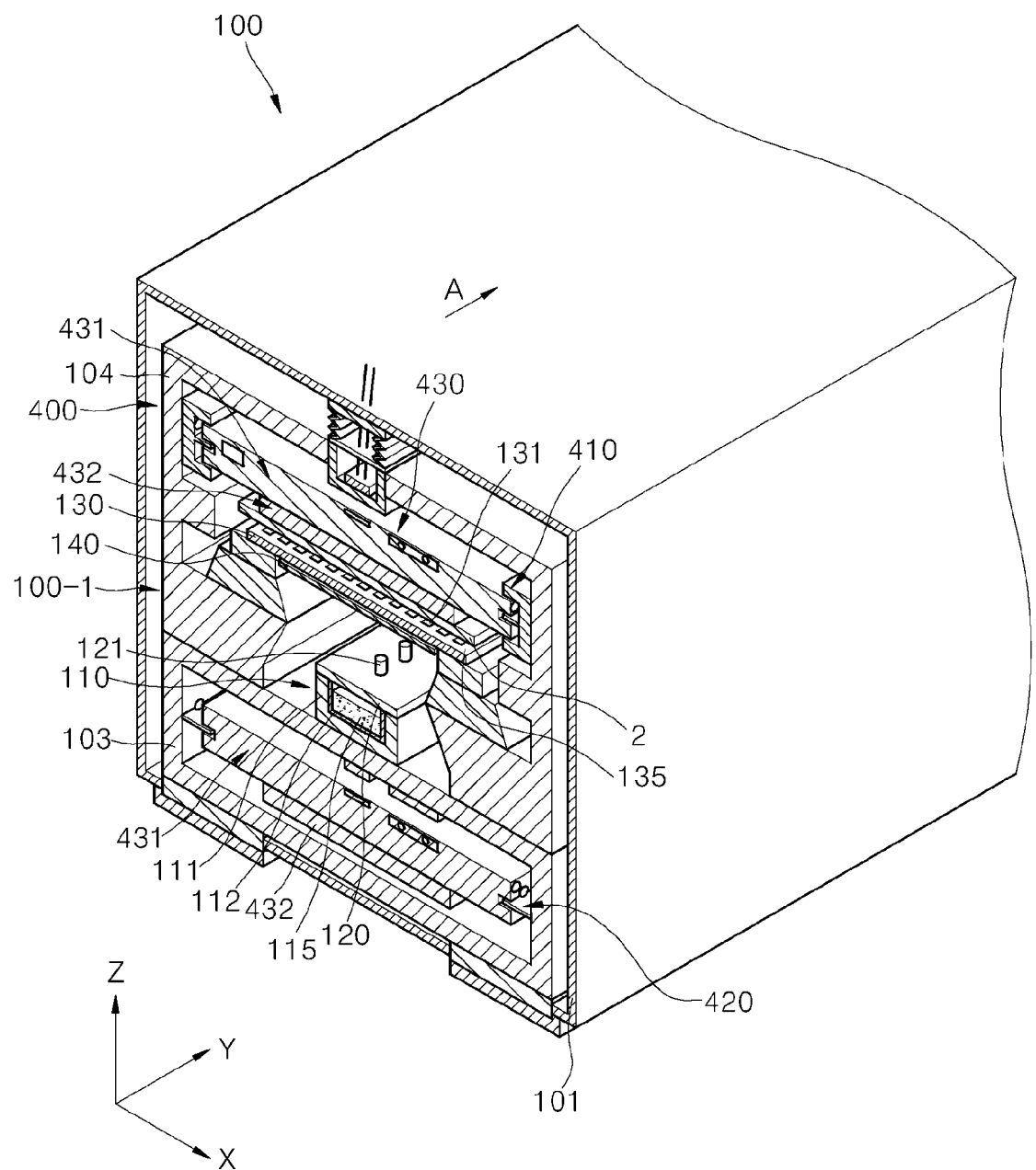
FIG. 3 is a schematic perspective view illustrating the deposition unit of FIG. 1.
Figure 4:
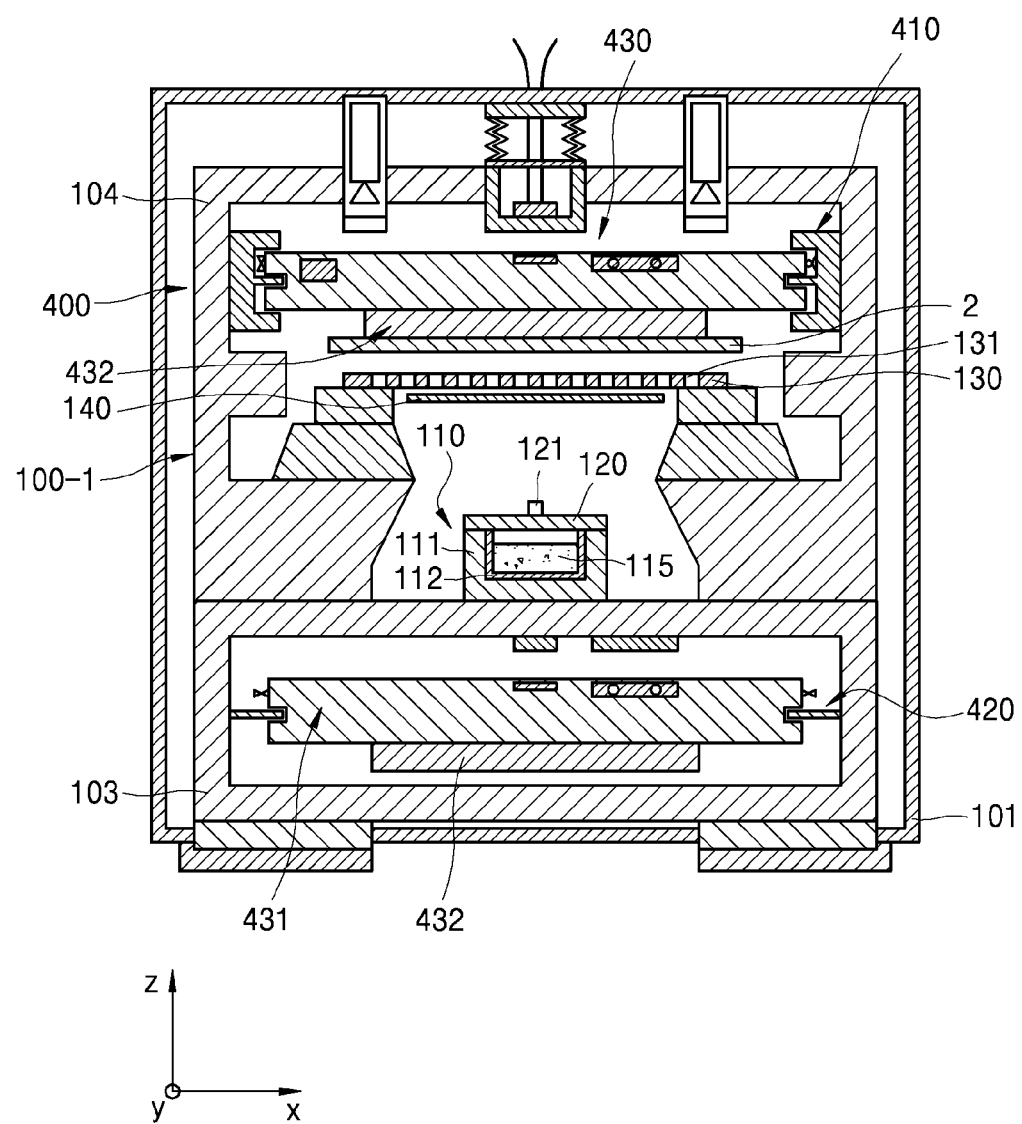
FIG. 4 is a schematic cross-sectional view of the deposition unit of FIG. 3.

FIG. 3 is a schematic perspective view illustrating the deposition unit 100 of FIG. 1, and FIG. 4 is a schematic cross-sectional view of the deposition unit 100 of FIG. 3. Referring to FIGS. 3 and 4, the deposition unit 100 includes at least one organic layer deposition assembly, for example, the organic layer deposition assembly 100-1, and the conveyer unit 400.

The chamber 101 is in the form of a hollow box, and the organic layer deposition assembly 100-1 and the conveyer unit 400 are accommodated in the chamber 101. An upper housing 104 and a lower housing 103 are formed in the chamber 101. In detail, the organic layer deposition assembly 100-1 and the first conveyer unit 410 are formed in the upper housing 104, and the second conveyer unit 420 is formed in the lower housing 103. Also, deposition is continuously performed as the moving unit 430 circularly moves between the first conveyer unit 410 and the second conveyer unit 420.

The organic layer deposition assembly 100-1 includes a deposition source 110, a deposition source nozzle unit 120, a patterning slit sheet 130, and a shielding member 140 or the like. The substrate 2, on which deposition is performed, is arranged in the chamber 101. The substrate 2 may be a substrate for a flat panel display device. For example, a large substrate of a size of 40 inches or greater, such as a mother glass, from which a plurality of flat panel displays may be manufactured, may be used as the substrate 2.

According to the organic layer deposition apparatus 1 illustrated in FIG. 3, deposition is performed by moving the substrate 2 relative to the organic layer deposition assembly 100-1. That is, the substrate 2 that is disposed to face the organic layer deposition assembly 100-1 moves in a Y-axis direction, such that deposition continuously occurs. In other words, deposition is performed in a scanning manner as the substrate 2 moves in an arrow direction A of FIG. 3. Thus, the patterning slit sheet 130 may be much smaller than an FMM used in a conventional deposition method. In other words, in the organic layer deposition assembly 100-1, deposition is continuously performed, i.e., in a scanning manner while the substrate 2 is moved in the Y-axis direction. Thus, at least one of the lengths of the patterning slit sheet 130 in X-axis and Y-axis directions may be much less than a length of the substrate 2. Since the patterning slit sheet 130 may be formed much smaller than the FMM used in a conventional deposition method, it is easy to manufacture the patterning slit sheet 130. In order to perform deposition while the substrate 2 is moved relative to the organic layer deposition assembly 100-1 as described above, the organic layer deposition assembly 100-1 and the substrate 2 may be spaced apart from each other by a certain distance.

The deposition source 110 contains and heats a deposition material 115 and is disposed at a side opposite to (facing) a side in which the substrate 2 is disposed in the chamber. As the deposition material 115 contained in the deposition source 110 is vaporized, deposition is performed on the substrate 2. In detail, the deposition source 110 includes a crucible 111 that is filled with the deposition material 115 and a heater 112 that heats the crucible 111 so as to vaporize the deposition material 115. The vaporized deposition material 115 moves toward the deposition source nozzle unit 120.

The deposition source nozzle unit 120 is disposed at a side of the deposition source 110, and in particular, at the side of the deposition source 110 facing the substrate 2. The deposition source nozzle unit 120 includes at least one deposition source nozzle 121 in the center thereof. The deposition material 115 that has been vaporized in the deposition source 110 passes through the deposition source nozzle 121 and then proceeds toward the substrate 2.

The patterning slit sheet 130 may be disposed between the deposition source 110 and the substrate 2. The patterning slit sheet 130 may further include a frame 135 having a lattice shape. The patterning slit sheet 130 includes a plurality of patterning slits 131 arranged in the X-axis direction. The deposition material 115 that has been vaporized in the deposition source 110 passes through the deposition source nozzle unit 120 and the patterning slit sheet 130, and then proceeds toward the substrate 2.

As described above, deposition is performed while the substrate 2 is moved relative to the organic layer deposition assembly 100-1. In order for the organic layer deposition assembly 100-1 to be moved relative to the substrate 2, the patterning slit sheet 130 is spaced apart from the substrate 2 by a certain distance.

Referring to FIGS. 3 and 4, the conveyer unit 400 includes the first conveyer unit 410, the second conveyer unit 420, and the moving unit 430. The first conveyer unit 410 conveys the moving unit 430, which includes a carrier 431 and an electrostatic chuck 432 coupled to the carrier 431, and the substrate 2 attached to the moving unit 430, in an in-line manner, so that an organic layer may be deposited on the substrate 2 through the organic layer deposition assembly 100-1.

The second conveyer unit 420 returns the moving unit 430, from which the substrate 2 is separated, in the unloading unit 300, after first deposition is completed by passing through the deposition unit 100. The moving unit 430 includes the carrier 431 that is conveyed along the first conveyer unit 410 and the second conveyer unit 420 and the electrostatic chuck 432 that is coupled to a surface of the carrier 431 and to which the substrate 2 is attached.

Figure 5:
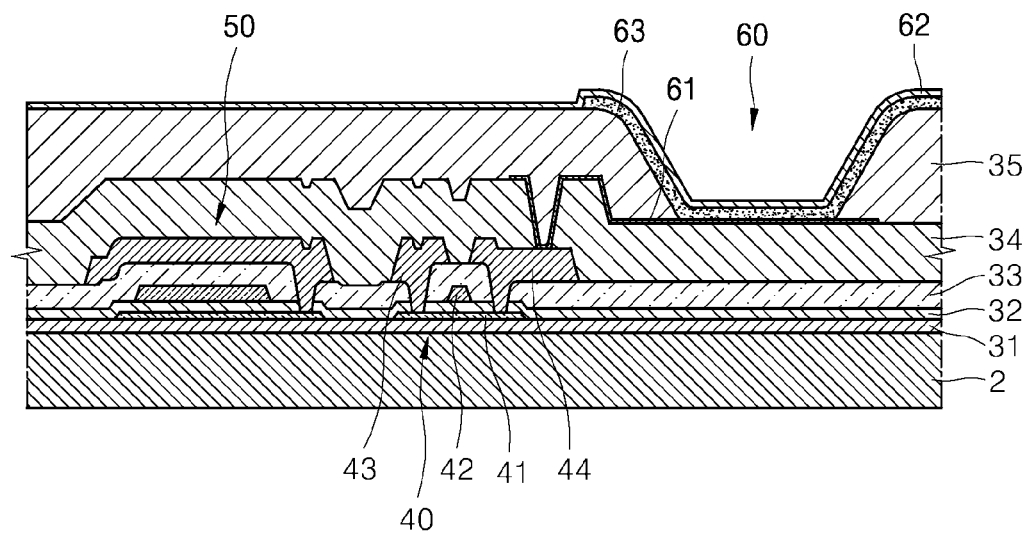
FIG. 5 is a cross-sectional view of an active matrix-type organic light-emitting display device manufactured by using the organic layer deposition apparatus of FIG. 1.

FIG. 5 is a cross-sectional view of an active matrix-type organic light-emitting display device manufactured by using the organic layer deposition apparatus 1 of FIG. 1. Referring to FIG. 5, the active matrix-type organic light-emitting display device is formed on a substrate 2. The substrate 2 may be formed of a transparent material, for example, a glass material, a plastic material, or a metal. An insulation layer 31, such as a buffer layer, is formed completely on the substrate 2.

A thin film transistor (TFT) 40, a capacitor 50, and an organic light-emitting device 60 are formed on the insulation layer 31. A semiconductor active layer 41 is formed on the insulation layer 31 in a predetermined pattern. The semiconductor active layer 41 is covered by a gate insulation layer 32. The semiconductor active layer 41 may be formed of a p-type or an n-type semiconductor.

A gate electrode 42 of a TFT 40 is formed on a portion of the gate insulation layer 32 corresponding to the semiconductor active layer 41. Also, an interlayer insulation layer 33 is formed to cover the gate electrode 42. After the interlayer insulation layer 33 is formed, the gate insulation layer 32 and the interlayer insulation layer 33 are etched by an etching operation, such as dry etching, to form a contact hole to expose a portion of the semiconductor active layer 41.

Next, a source electrode 43 and a drain electrode 44 are formed on the interlayer insulation layer 33 to contact the portion of the semiconductor active layer 41 that is exposed through the contact hole. A passivation layer 34 is formed to cover the source and drain electrodes 43. The passivation layer 34 is etched by an etching operation to expose a portion of the drain electrode 44. An insulation layer may be further formed on the passivation layer 34, in order to planarize the passivation layer 34.

The organic light-emitting device 60 is formed to generate red, green, or blue light according to current, so as to display predetermined image information, and a first electrode 61 is formed on the passivation layer 34. The first electrode 61 is electrically connected to the drain electrode 44 of the TFT 40.

A pixel-defining layer 35 is formed to cover the first electrode 61. A predetermined opening is formed in the pixel-defining layer 35, and an organic layer 63, including an emission layer, is formed in the opening. A second electrode 62 is formed on the organic layer 63.

The pixel-defining layer 35 partitions each pixel. The pixel-defining layer 35 is formed of an organic material to planarize a surface of the substrate 2 on which the first electrode 61 is formed, particularly, a surface of the passivation layer 34.

The first electrode 61 and the second electrode 62 are insulated from each other, and they respectively apply voltages of different polarities to the organic layer 63, including the emission layer, to thereby emit light. That is, the organic layer 63 illustrated in FIG. 5 is deposited by using the organic layer deposition apparatus 1 illustrated in FIG. 1. The organic layer 63 may be formed of a low molecular weight or a high molecular weight organic material. When a low molecular weight organic material is used, a hole injection layer (HIL), a hole transport layer (HTL), an emission layer (EML), an electron transport layer (ETL), and an electron injection layer (EIL) may be stacked in a single layer structure or a multi-layer structure. Also, various organic materials, such as copper phthalocyanine (CuPc), N,N'-Di(naphthalene-1-yl)-N, N'-diphenyl-benzidine (NPB), and tris-8-hydroxyquinoline aluminum (Alq3), may be used.

After forming the organic layer 63, the second electrode 62 may also be formed by using the same deposition operation. The first electrode 61 may function as an anode, and the second electrode 62 may function as a cathode. However, the polarities of the first electrode 61 and the second electrode 62 may be reversed. In addition, the first electrode 61 may be patterned in to correspond to each pixel area, and the second electrode 62 may be formed to cover all pixels.

The first electrode 61 may be formed as a transparent electrode or a reflective electrode. When the first electrode 61 is a transparent electrode, it may be formed of ITO, IZO, ZnO, or $In_2O_3$. When the first electrode 61 is a reflective electrode, first, a reflective layer may be formed of Ag, Mg, Al, Pt, Pd, Au, Ni, Nd, Ir, Cr, or a combination thereof, and then a transparent electrode layer may be formed of ITO, IZO, ZnO, or $In_2O_3$ on the reflective layer. The first electrode 61 may be formed by, for example, a sputtering method, and then may be patterned by a photolithography method.

The second electrode 62 may also be formed as a transparent electrode or a reflective electrode. When the second electrode 62 is a transparent electrode, it is used as a cathode electrode, and thus, a metal having a small work function, that is, Li, Ca, LiF/Ca, LiF/Al, Al, Ag, Mg, or a compound of these, may be deposited to face the organic layer 63, and an auxiliary electrode layer or a bus electrode line may be formed of ITO, IZO, ZnO, or $In_2O_3$. When the second electrode 62 is a reflective electrode, Li, Ca, LiF/Ca, LiF/Al, Al, Ag, Mg, or a combination thereof is completely deposited. The deposition may also be performed in the same manner as described above for forming the organic layer 63.

The organic layer deposition apparatus 1 may be also applied in the deposition of an organic layer or an inorganic layer of an organic TFT, or in layer-forming operations of other various materials.

Figure 6:
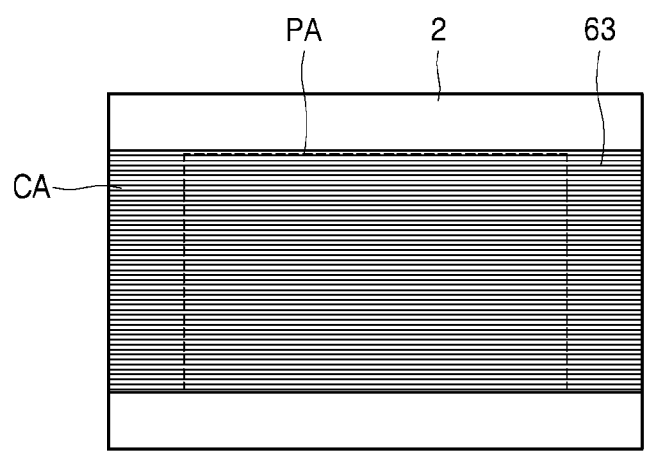
FIG. 6 illustrates an organic layer that is deposited by using the organic layer deposition apparatus of FIG. 1.
Figure 7:
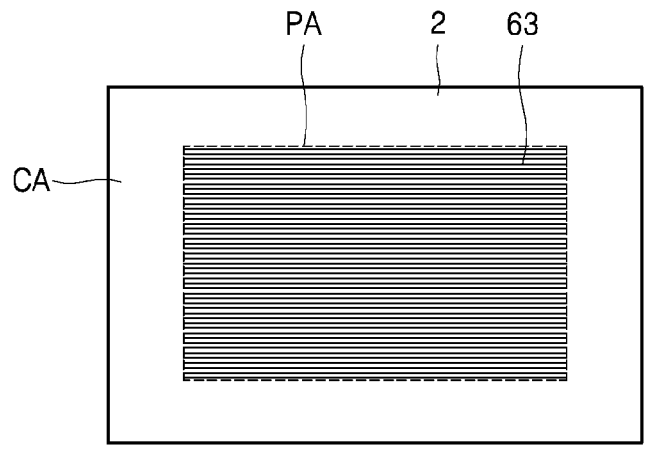
FIG. 7 illustrates a non-layer forming area from which an organic layer that was deposited in the non-layer forming area is removed by using an organic layer etching apparatus according to an exemplary embodiment of the present invention.

Hereinafter, a method of manufacturing an organic light-emitting display device by using the organic layer deposition apparatus 1 illustrated in FIG. 1 and an apparatus for etching an organic layer, according to an embodiment of the present invention, will be described in detail. FIG. 6 illustrates an organic layer that is deposited by using the organic layer deposition apparatus 1 of FIG. 1. FIG. 7 illustrates a non-layer forming area from which an organic layer that was deposited in the non-layer forming area is removed by using an organic layer etching apparatus according to an exemplary embodiment of the present invention. Herein, "removing" the organic layer does not necessarily require the complete removal of the organic layer from the non-layer forming area, as some trace amounts of the organic layer may remain.

First, a TFT 40 (see FIG. 5), a capacitor 50 (see FIG. 5), a first electrode 61 (see FIG. 5), and a pixel-defining layer 35 (see FIG. 5) are sequentially formed on a substrate 2. Next, as illustrated in FIG. 6, an organic layer 63 is formed on the first electrode 61 and the pixel-defining layer 35 of the substrate 2 by using the organic layer deposition apparatus 1 illustrated in FIG. 1.

As described above, the organic layer deposition apparatus 1 includes a patterning slit sheet that has a significantly smaller size than a conventional FMM. In order to deposit an organic layer on a substrate by using the patterning slit sheet, deposition is performed as the organic layer deposition apparatus 1 and the substrate 2 move relative to each other. Deposition is performed in a scanning manner as the substrate 2 moves in a predetermined direction. Accordingly, the organic layer 63 is continuously formed on the substrate 2, once the deposition is completed, in a line form, as illustrated in FIG. 6.

An organic light-emitting display apparatus includes a pixel area PA from which light is emitted and a non-pixel area disposed adjacent thereto. The non-pixel area includes a circuit area CA disposed outside the pixel area PA. The circuit area CA is used as a terminal in product inspection or during the subsequent manufacture of a product. However, if an organic layer is formed in the circuit area CA, the circuit area CA may not be able to function as an electrode, and thus, the circuit area CA generally is a non-layer forming area where no layers, such as an organic layer, are present. However, as described above, since deposition is performed in a scanning manner in the organic layer deposition apparatus 1 illustrated in FIG. 1, as the substrate 2 moves relative to the organic layer deposition apparatus 1, it is difficult to prevent deposition of an organic layer in the circuit area CA of the substrate 2.

An additional device such as a shutter or a blinder may be included to cover the non-layer forming area to prevent this. However, as an additional device has to be included, the size of the organic layer deposition apparatus 1 and manufacturing costs are increased.

In order to solve at least the above-described problem, an organic layer formed in the circuit area CA is removed by using the organic layer etching apparatus, according to an exemplary embodiment of the present invention. That is, in a state as illustrated in FIG. 6, a chemical etching method using plasma containing oxygen ($O_2$) may be performed by the organic layer etching apparatus to remove the organic layer in the circuit area CA.

Figure 8:
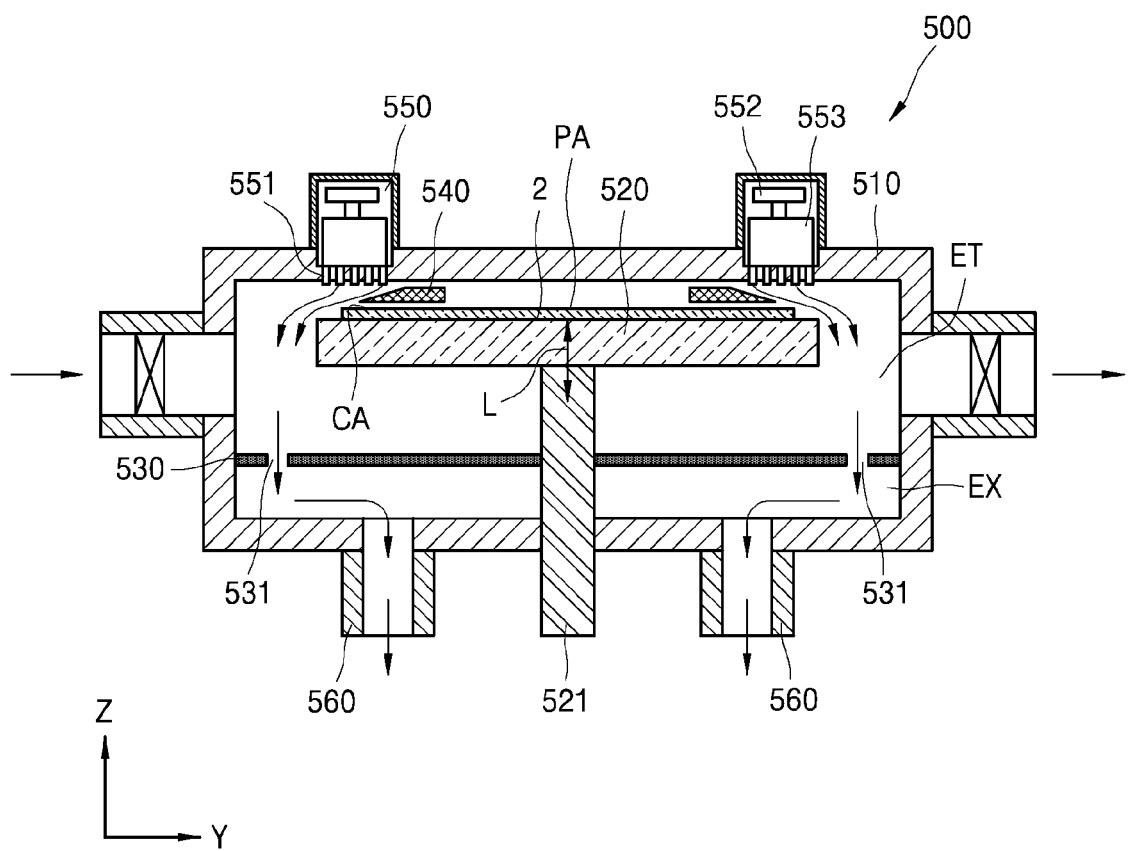
FIG. 8 is a cross-sectional view illustrating an organic layer etching apparatus according to an exemplary embodiment of the present invention.
Figure 9:
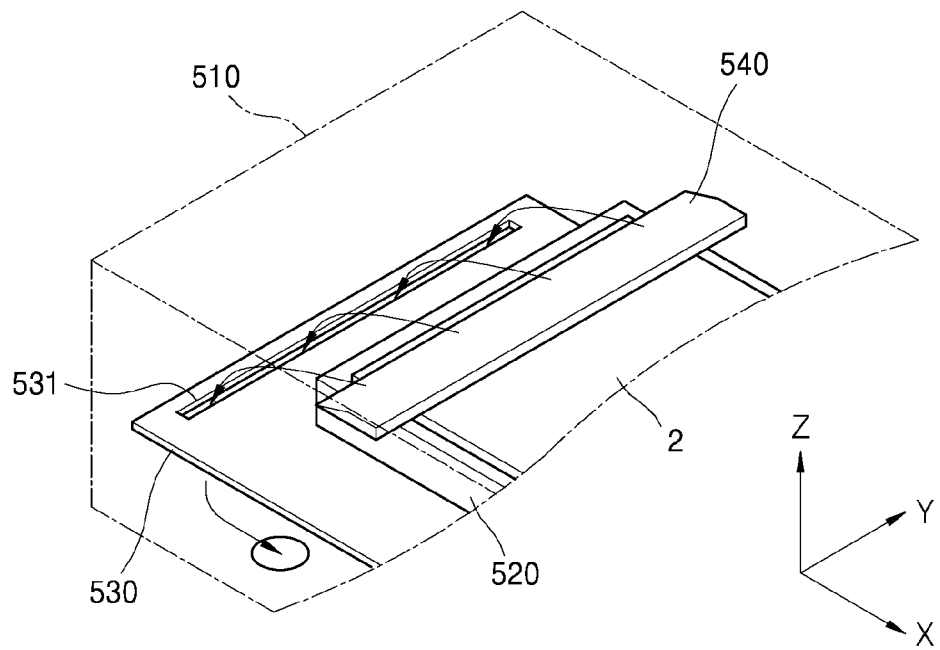
FIG. 9 is a schematic perspective view of the organic layer etching apparatus of FIG. 8 according to an exemplary embodiment of the present invention.

FIG. 8 is a cross-sectional view illustrating an organic layer etching apparatus 500 according to an exemplary embodiment of the present invention. FIG. 9 is a schematic perspective view of the organic layer etching apparatus 500 of FIG. 8. Referring to FIGS. 8 and 9, the organic layer etching apparatus 500 includes an etching chamber 510, a stage 520, a dividing member 530, a mask 540, a plasma generator 550, and a discharging unit 560.

In an organic layer etching apparatus of the conventional art, an exhaust port formed in the bottom of an etching chamber is disposed below a stage. Thus, plasma flows sequentially through a plasma ejecting unit, a substrate, along the circumference of the stage, in a lower portion of a chamber, and to an exhaust port. Since this plasma path is relatively broad, a minimum path from the plasma ejecting unit to the exhaust port is a main path of flow of the plasma. Accordingly, plasma concentrated near the exhaust port flows back to the substrate and to an upper surface of the stage, resulting in unnecessary etching of a pixel area.

To solve this and or other problems, the organic layer etching apparatus 500 includes the mask 540 to guide plasma the outside of a substrate 2, and the dividing member 530 in which at least one discharge slit 531 is formed, to block the plasma from entering the pixel area of the substrate.

The etching chamber 510 forms etching space that is maintained at a vacuum while etching is being performed. Also, components for etching an organic layer are disposed in the etching chamber 510.

The stage 520 functions as a mounting unit on which the substrate 2 is mounted. The stage 520 is movable in the etching chamber 510 in a vertical direction, that is, in an arrow direction L, as illustrated in FIG. 8. The stage 520 may be moved by a rod 521 disposed below the stage 520. When the stage 520 is lowered in the chamber 510, the substrate 2, on which an organic layer is deposited by the organic layer deposition apparatus 1, is transported into the etching chamber 510 and mounted on the stage 520. Then, the stage 520 is lifted until the substrate 2 and the mask 540 are adjacent to or closely adhered to each other. However, according to some embodiments, the mask 540 may be moved relative to the stage 520, or both the mask 540 and the stage 520 may be moved relative to each other.

The dividing member 530 divides the etching chamber 510 into an etching space ET and a discharge space EX. Also, at least one discharge slit 531 is formed in the dividing member 530, so as to form a path through which plasma may move from the etching space ET to the discharge space EX. The discharge slit 531 may be formed outside an area corresponding to the substrate 2. That is, the discharge slit 531 is formed at a position where the plasma that has removed the organic layer deposited in the circuit area CA may be discharged to the discharge space EX. According to the current exemplary embodiment, the discharge slit 531 may be a stripe-shape single slit that extends in a Y-axis direction parallel to the mask 540.

The mask 540 is formed between the substrate 2 and the plasma generator 550 to guide a movement path of the plasma, such that the plasma does not enter the pixel area PA. That is, the mask 540 is formed to cover a boundary of the pixel area PA of the substrate 2, so as to guide the plasma generated in the plasma generator 550 to an outer portion of the substrate 2 by a plasma ejecting unit 551.

The mask 540 may be tapered towards the outer side of the substrate 2, so as to guide the plasma. That is, an outer portion of the mask 540 may be inclined such that the plasma supplied into the etching chamber 510 flows to an outer portion of the substrate 2. Accordingly, plasma is prevented from entering the pixel area PA of the substrate 2 by the mask 540.

The mask 540 illustrated in FIGS. 8 and 9 is in the form of a flat plate that extends in the Y-axis direction. However, the present invention is not limited thereto, and the mask 540 may have various forms, as long as it covers the boundary of the pixel area PA of the substrate 2, so as to block plasma from entering the pixel area PA.

The plasma generator 550 is formed at a side of the etching chamber 510. The plasma generator 550 supplies the plasma to the etching chamber 510. The plasma generator 550 may include a plasma gas supply source 552 and a plasma generating element 553. The plasma gas supplied from the plasma gas supply source 552 is formed into plasma by using the plasma generating element 553 and is supplied into the etching chamber 510 via the plasma ejecting unit 551. For example, a mixed gas of $CF_4$ and $O_2$ may be used as the plasma gas. Alternatively, a transport gas, such as $N_2$, may be mixed with the plasma. The plasma generated in the plasma generator 550 may include ions having charges and radicals having no charges.

The plasma generator 550 may include the plasma ejecting unit 551. The plasma ejecting unit 551 may be formed, for example, in the form of a shower head, and may be disposed on the substrate 2 in the etching chamber 510, so as to eject the plasma generated in the plasma generator 550 from an upper portion of the etching chamber 510 toward the substrate 2.

The discharging unit 560 functions as a path through which the plasma in the discharge space EX of the etching chamber 510 is discharged out of the etching chamber 510. A discharge pump (not shown) may be disposed at a side of the discharging unit 560 so that the plasma may be discharged out of the etching chamber 510.

As a result, the plasma ejected into the etching chamber 510 by the plasma ejecting unit 551 is blocked by the mask 540, which covers the pixel area PA of the substrate 2 (or which covers a boundary of the pixel area PA of the substrate 2) from entering the pixel area PA of the substrate 2, and only removes the organic layer deposited in the circuit area CA, by passing through the circuit area CA along the inclined portion of the mask 540. The plasma moves to the discharge space EX through the discharge slit 530 of the dividing member 530, after removing the organic layer, and is discharged out of the etching chamber 510 through the discharging unit 560. The plasma flows to the discharging unit 560 through the discharge slit 531 formed below the substrate 2. Accordingly, the plasma does not flow backward to the substrate 2. Also, by forming the discharge slit 531 at a position parallel to the substrate 2, a flow of the plasma in the etching chamber 510 may be uniform, thereby improving etching uniformity.

Figure 10:
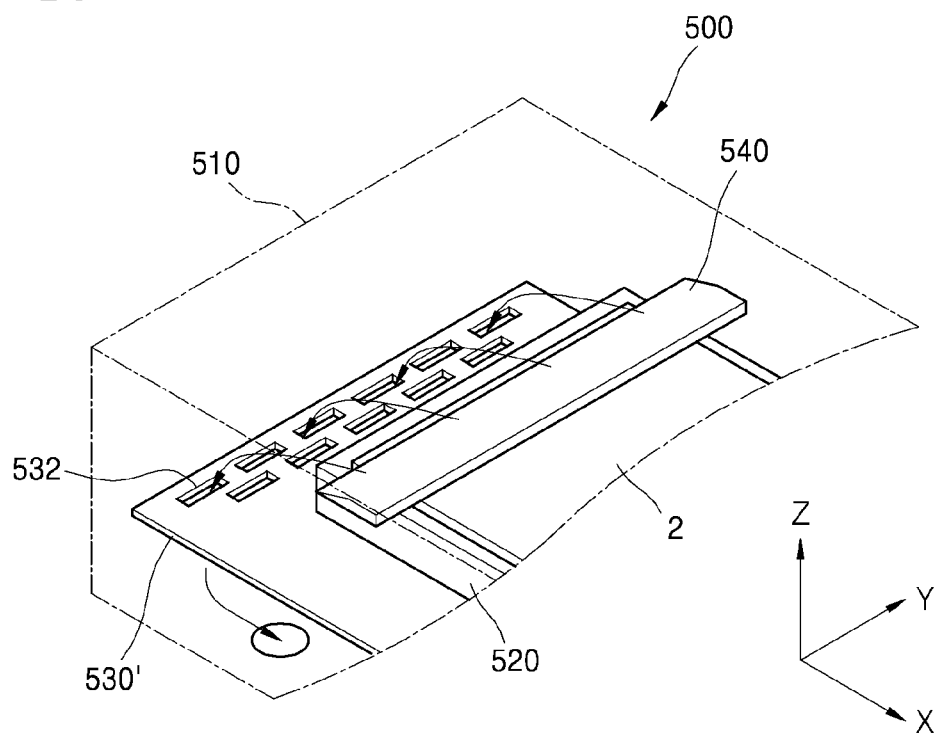
FIG. 10 is a schematic perspective view illustrating an organic layer etching apparatus according to another exemplary embodiment of the present invention.

FIG. 10 is a schematic perspective view illustrating an organic layer etching apparatus 500, according to another exemplary embodiment of the present invention. Referring to FIG. 10, the organic layer etching apparatus 500 includes an etching chamber 510, a stage 520, a dividing member 530', a mask 540, a plasma generator 550, and a discharging unit 560. The organic layer etching apparatus 500 of FIG. 10 is different from the organic layer etching apparatus 500 of FIG. 9 with regard to the dividing member 530'. That is the dividing member 530' includes a plurality of discharge slits 532. Accordingly, plasma that passes through each of the slits 532 flows uniformly. Compared to the discharge slit 531 of FIG. 8, which is a single unit and is relatively thin, the structural strength of the discharge slits 532 of the dividing member 530 is increased, so as to allow easy maintenance of measurement precision of the discharge slits 532. That is, the assembly or disassembly of the organic layer etching apparatus 500 is simplified, for maintenance thereof.

Figure 11:
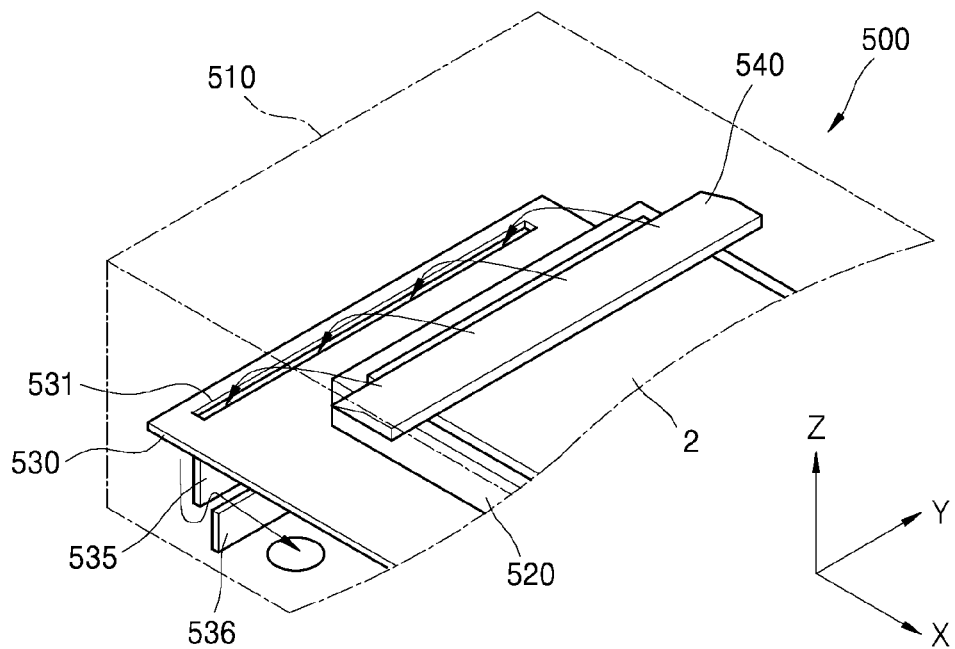
FIG. 11 is a schematic perspective view illustrating an organic layer etching apparatus according to another exemplary embodiment of the present invention.

FIG. 11 is a schematic perspective view illustrating a modified version of the organic layer etching apparatus 500, according to another exemplary embodiment of the present invention. Referring to FIG. 11, organic layer etching apparatus 500 of FIG. 11 includes first and second shielding members 535 and 536, in addition to the components included in the organic layer etching apparatus 500 of FIG. 9. The first and second shielding members 535 and 536 protrude in a Z-axis direction in discharge space EX. The first shielding member 535 may extend downwardly from the dividing member 530, and the second shielding member 536 may extend upwardly from a bottom surface of the etching chamber 510.

The first and second shielding member 535 and 536 may be formed at a side of the discharge slit 531, preferably inwards from the discharge slit 531, to thereby guide plasma that has entered the discharge space exemplary, such that the plasma is discharged through the discharging unit 560. In other words, the first and second shielding members 535 and 536 form a non-linear path from the discharge slit 531 to the discharging unit 560 and that allow a discharge resistance to increase locally in the discharge space EX. The first and second shielding members 535 and 536 increase the discharge resistance, and the variation in the discharge resistance of various paths from the plasma ejecting unit 551 to the discharging unit 560 is reduced relatively. Accordingly, a plasma flow that is not uniform due to the variation in the discharge resistance may be reduced, and a uniform flow of plasma in the etching chamber 510 may be provided.

FIGS. 12 through 15 are schematic views illustrating a method of etching an organic layer using the organic layer etching apparatus 500, according to another embodiment of the present invention. Referring to FIGS. 12 through 15, the method includes: mounting a substrate, on which an organic layer is deposited, on a stage in an etching chamber; disposing a mask to cover at least a portion of the substrate as the stage moves in a first direction, such that the substrate and the mask are closely adhered to each other or are adjacent to each other; removing the organic layer formed in the circuit area of the substrate by ejecting plasma generated in a plasma generator into the etching chamber; and discharging the plasma that has removed the organic layer, out of the etching chamber.

Figure 12:
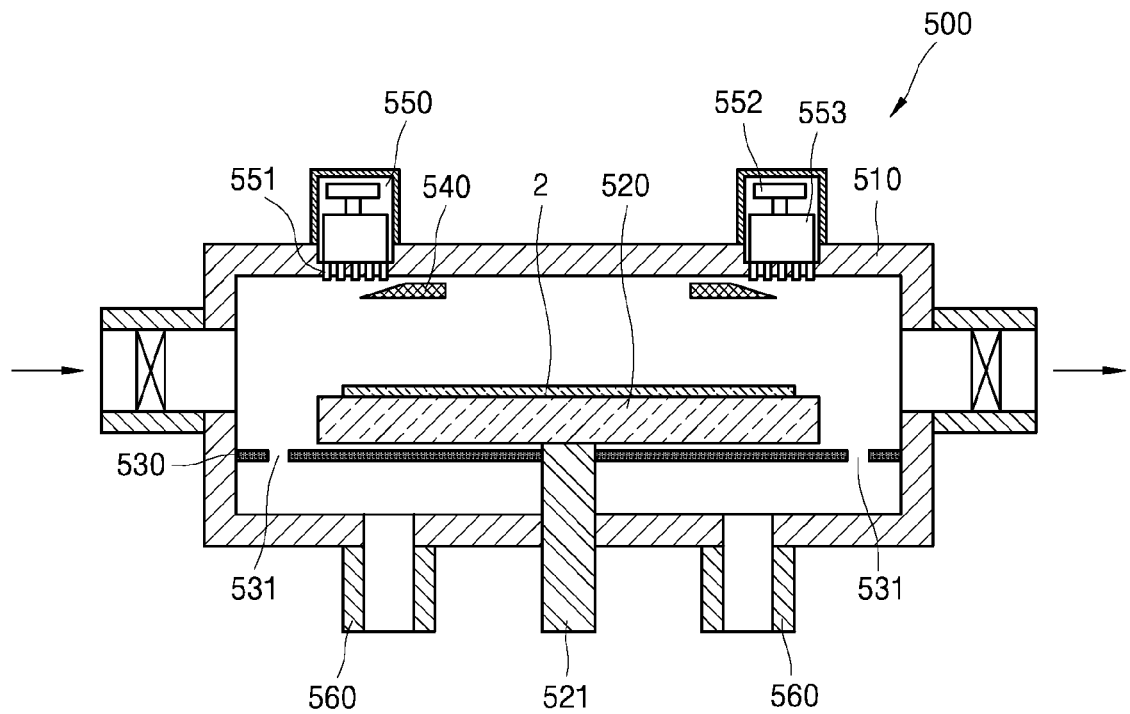
FIGS. 12 through 15 are schematic views illustrating a method of etching an organic layer, according to another exemplary embodiment of the present invention.

In detail, a substrate 2, on which deposition of an organic layer is completed in the organic layer deposition apparatus 1 of FIG. 1, is transported from the organic layer deposition apparatus 1 to the organic layer etching apparatus 500. That is, while the stage 520 is moved to a lower portion in the etching chamber 510, as illustrated in FIG. 12, the substrate 2 is input into the etching chamber 510 to be mounted on the stage 520. The stage 520 may be moved by a rod 521 disposed below the stage 520.

Figure 13:
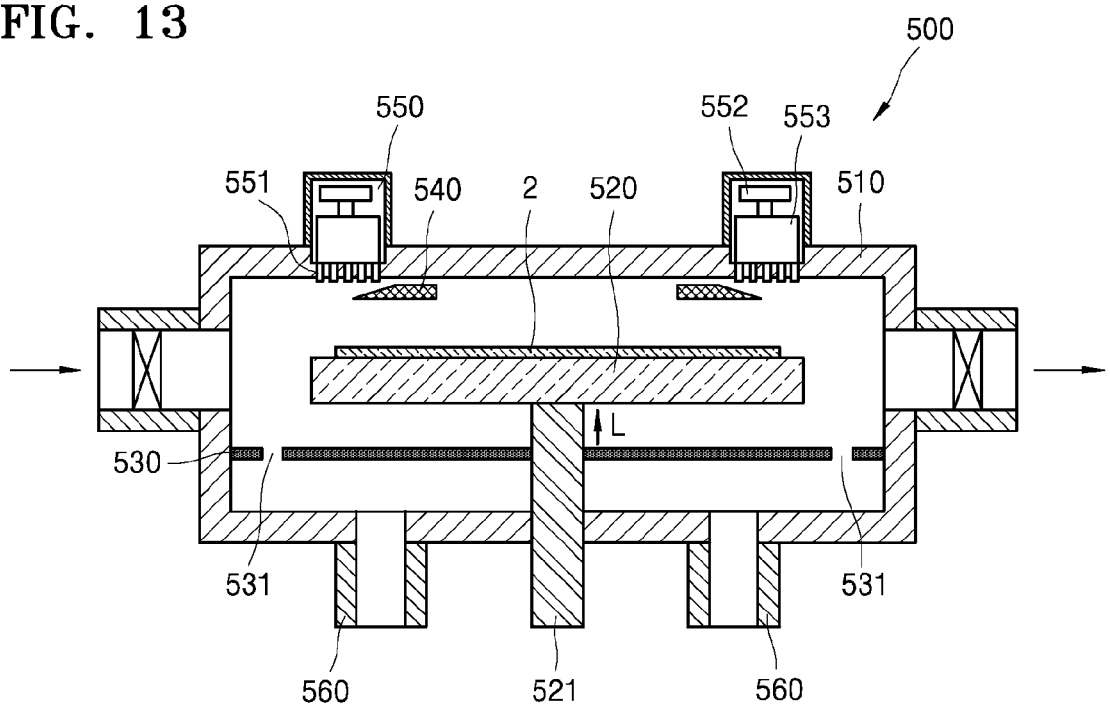
Figure 14:
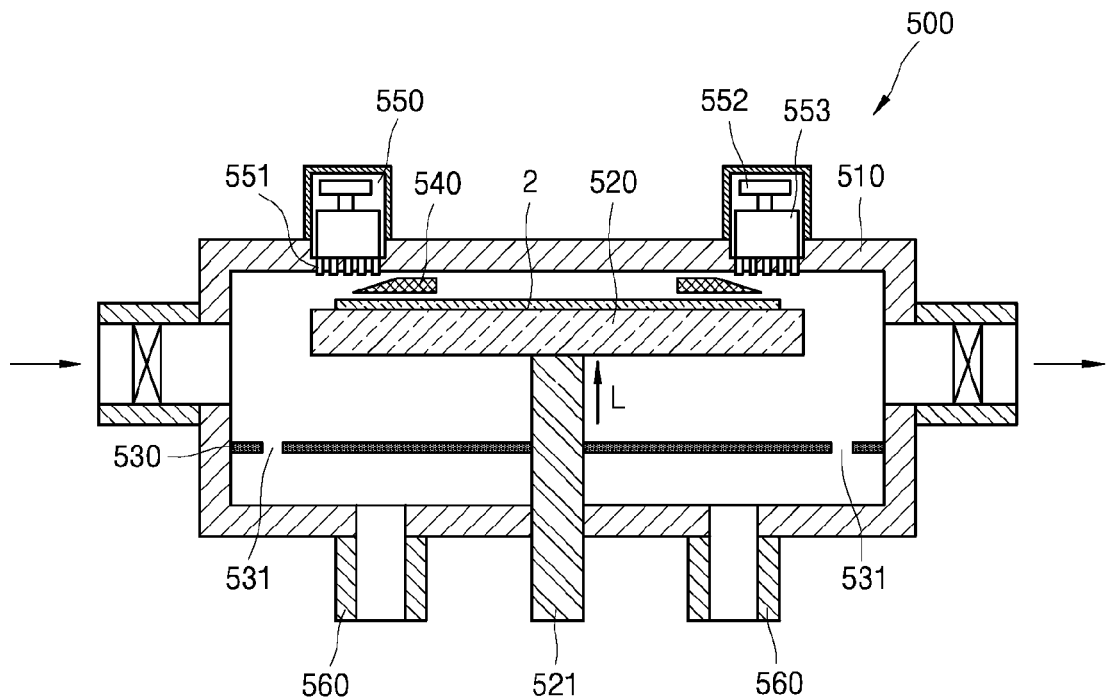

When the substrate 2 is mounted on the stage 520, the stage 520 starts to rise in an arrow direction L, as illustrated in FIG. 13, so that the substrate 2 and a mask 540 approach each other or are closely adhered to each other, as illustrated in FIG. 14. In this manner, an interval between the substrate 2 and the mask 540 is adjusted by movement of the stage 520.

The mask 540 is formed between the substrate 2 and the plasma generator 550 and guides plasma, such that the plasma does not enter the pixel area PA and is confined to a non-layer forming area. That is, the mask 540 is formed to cover a boundary of the pixel area PA of the substrate 2 and guides the plasma generated in the plasma generator 550 to an outer portion of the substrate 2.

Figure 15:
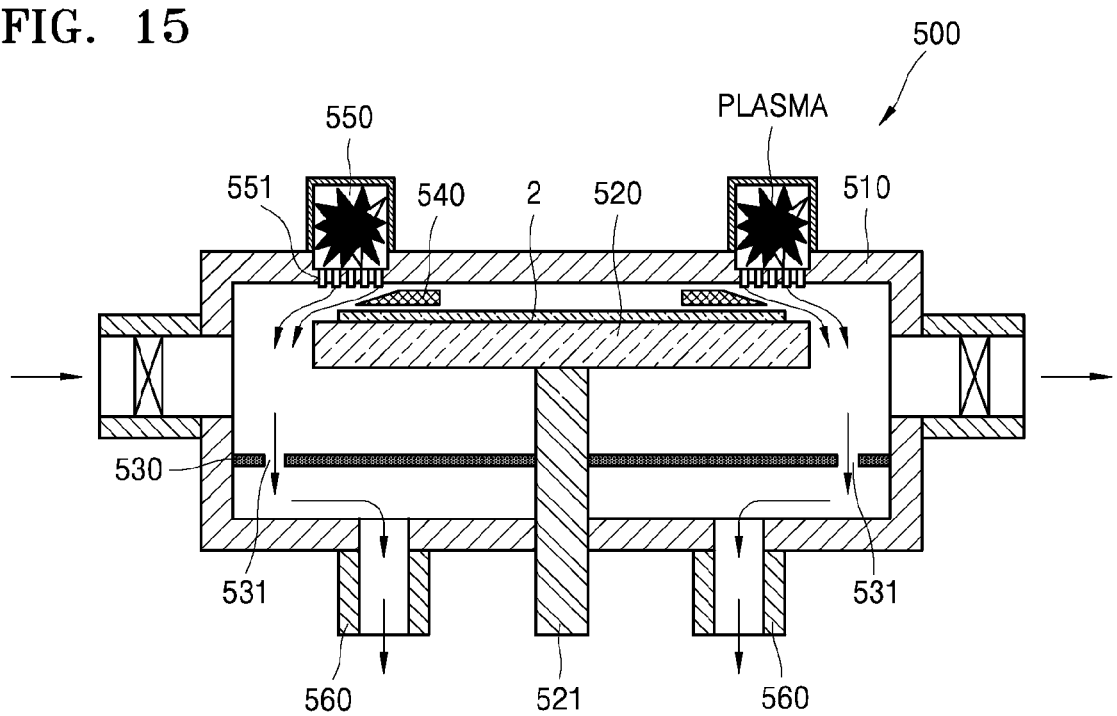

As described above, when the substrate 2 and the mask 540 approach each other or closely contact each other, as illustrated in FIG. 15, plasma is generated in the plasma generator 550, and the generated plasma is ejected into the etching chamber 510 through the plasma ejecting unit 551. Accordingly, the organic layer is removed from the circuit area CA of the substrate 2.

Next, the plasma that has removed the organic layer is discharged out of the etching chamber 510. The etching chamber 510 is divided into etching space ET and discharge space EX by the dividing member 530, and at least one discharge slit is formed in the dividing member 530, through which the plasma in the etching space ET may move to the discharge space EX.

Although not shown in FIGS. 12 through 15, after the organic layer formed in the circuit area CA is removed, the stage 520 descends in an opposite direction to the arrow direction L. After the substrate 2 is discharged out of the etching chamber 510, a new substrate 2 is transported from the organic layer deposition apparatus 1.

According to the embodiments of the present invention, a back flow of plasma into a pixel area, which results in etching of the pixel area, may be prevented. In addition, a uniform flow of plasma in an etching chamber may be provided to improve etching uniformity.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of etching an organic layer disposed on a non-pixel area of a substrate, the method comprising:
    disposing the substrate on a stage disposed in an etching chamber;
    covering at least a portion of the substrate with a mask disposed in the etching chamber, by decreasing the distance between the stage and the mask; and
    etching an organic layer disposed on a non-pixel area of the substrate, by using the mask to direct plasma supplied to the etching chamber, toward the non-pixel area of the substrate.

2. The method of claim 1, wherein the mask covers at least a portion of a pixel area of the substrate.

3. The method of claim 2, wherein the mask covers edges of the pixel area.

4. The method of claim 1, wherein the mask directs the plasma toward to an outer portion of the substrate.

5. The method of claim 1, wherein the mask directs the plasma away from a pixel area of the substrate.

6. The method of claim 1, further comprising discharging the plasma from the etching chamber after the plasma is directed toward the non-pixel area.

7. The method of claim 6, wherein:
    the etching chamber is divided into an etching space and a discharge space by a dividing member; and
    the discharging comprises discharging the plasma from the etching space, through a discharge slit of the dividing member, and into the discharge space.

8. The method of claim 7, wherein the discharge slit is disposed adjacent to an edge of the stage.

9. The method of claim 7, wherein the discharging of the plasma into the discharge space comprises using a shielding member disposed in the discharge space to increase a discharge resistance of the plasma being discharged from the etching space.

10. The method of claim 7, wherein a flow of the plasma in the discharging space is obstructed by a shielding member disposed in the discharge space, such that the plasma travels along a non-linear path from the at least one discharge slit to the discharging unit, thereby increasing a local discharge resistance to the discharge of the plasma.

* * * * *